(12) United States Patent
Toyoda

(10) Patent No.: US 11,677,033 B2
(45) Date of Patent: Jun. 13, 2023

(54) PASSIVE ELEMENT ON A SEMICONDUCTOR BASE BODY

(71) Applicant: FUJI ELECTRIC CO., LTD., Kawasaki (JP)

(72) Inventor: Yoshiaki Toyoda, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/509,693

(22) Filed: Oct. 25, 2021

(65) Prior Publication Data

US 2022/0190171 A1    Jun. 16, 2022

(30) Foreign Application Priority Data

Dec. 16, 2020 (JP) .............................. JP2020-208305

(51) Int. Cl.
*H01L 29/94* (2006.01)
*H01L 29/06* (2006.01)

(52) U.S. Cl.
CPC .......... *H01L 29/94* (2013.01); *H01L 29/0688* (2013.01)

(58) Field of Classification Search
CPC ............. H01L 27/0629; H01L 27/0805; H01L 23/642; H01L 29/94; H01L 29/0688; H01L 27/0922; H01L 28/60; H01L 29/7397; H01L 29/7803; H01L 29/7813
See application file for complete search history.

(56) References Cited

U.S. PATENT DOCUMENTS

| | | | |
|---|---|---|---|
| 2007/0235788 A1* | 10/2007 | Kao | ......................... H01L 28/60 |
| | | | 257/E21.582 |
| 2013/0093053 A1 | 4/2013 | Toyoda et al. | |
| 2016/0322349 A1* | 11/2016 | Xu | ....................... H01L 21/8234 |

FOREIGN PATENT DOCUMENTS

| | | |
|---|---|---|
| JP | 2003264289 A | 9/2003 |
| JP | 2009158779 A | 7/2009 |
| JP | 201389764 A | 5/2013 |
| JP | 6707917 B2 | 5/2020 |

\* cited by examiner

*Primary Examiner* — Wasiul Haider

(57) ABSTRACT

A semiconductor device includes: a semiconductor base body of a first conductivity-type; a first electrode electrically connected to the semiconductor base body; a first semiconductor region of a second conductivity-type provided at an upper part of the semiconductor base body; a second semiconductor region of the first conductivity-type provided at an upper part of the first semiconductor region; a second electrode electrically connected to the first semiconductor region; an insulating film provided on a top surface of the second semiconductor region; and a passive element provided on a top surface of the insulating film.

14 Claims, 17 Drawing Sheets

PASSIVE ELEMENT ON A SEMICONDUCTOR BASE BODY

CROSS-REFERENCE TO RELATED APPLICATION

This application claims benefit of priority under 35 USC 119 based on Japanese Patent Application No. 2020-208305 filed on Dec. 16, 2020, the entire contents of which are incorporated by reference herein.

BACKGROUND

1. Field of the Invention

The present invention relates to semiconductor devices, and more particularly, to a semiconductor device including a passive element arranged on a semiconductor substrate via an insulating film.

2. Description of the Related Art

High-side power ICs are known that include a power semiconductor element such as a vertical MOSFET at an output stage and a control circuit configured to control the power semiconductor element that are integrated (packaged together) on a single semiconductor chip. Such a high-side power IC includes, as semiconductor elements for the control circuit, various kinds of MOSFETs, resistive elements, and capacitive elements. An example of capacitive elements is a polysilicon-insulator-polysilicon (PIP) capacitive element. The PIP capacitive element has a stacked structure including a polysilicon layer, an insulating layer, and a polysilicon layer. Terminals composed of the upper and lower polysilicon layers are connected with various kinds of devices to implement a circuit. The high-side power IC is provided with a field oxide film (a LOCOS film) on which the PIP capacitive element is deposited.

JP 2009-158779 A discloses a structure in which a MOSFET and a PIP capacitive element on an insulating film are formed on a single substrate. JP 6707917 B and JP 2013-89764 A each disclose a structure in which insulating films are formed on various kinds of diffusion layers, and a polysilicon resistive element or a PIP capacitive element is deposited on the respective insulating films. JP 2003-264289 A discloses a structure in which a vertical MOSFET and a control circuit are integrated on a single substrate, and the integrated circuit is arranged on a p-well. A source potential of the MOSFET is applied to the p-well, and a capacitor is provided on the p-well via an oxide film.

In the respective semiconductor devices disclosed in JP 2009-158779 A, JP 6707917 B, JP 2013-89764 A, and JP 2003-264289 A, a parasitic capacitance that is a capacitive component is formed with no intention for a circuit design by the polysilicon film at the lower layer of the PIP capacitive element, the insulating film under the polysilicon film at the lower layer, and the semiconductor substrate under the insulating film.

Since the semiconductor substrate is connected to a high-potential terminal (a VCC terminal) in the high-side power IC, the parasitic capacitance leads to capacitive coupling between the high-potential terminal and an internal circuit in which the PIP capacitive element is used, and causes an error operation of the circuit.

The PIP capacitive element includes the polysilicon layers that are relatively large as compared with a polysilicon wiring layer or a polysilicon resistive element, and the parasitic capacitance thus has a relatively large capacitance value. Further, a reduction in thickness of the insulating film to decrease a difference in level of steps in association with an improvement in process shrink further increases the parasitic capacitance value, and increases a risk of causing an error operation of the circuit accordingly.

SUMMARY

In view of the foregoing problems, the present invention provides a semiconductor device contributing to a reduction in parasitic capacitance connected to a passive element such as a PIP capacitive element provided on a semiconductor substrate via an insulating film, and capable of suppressing an error operation of a circuit connected to the passive element.

An aspect of the present invention inheres in a semiconductor device including a semiconductor base body of a first conductivity-type; a first electrode electrically connected to the semiconductor base body; a first semiconductor region of a second conductivity-type provided at an upper part of the semiconductor base body; a second semiconductor region of the first conductivity-type provided at an upper part of the first semiconductor region; a second electrode electrically connected to the first semiconductor region; an insulating film provided on a top surface of the second semiconductor region; and a passive element provided on a top surface of the insulating film.

DETAILED DESCRIPTION

Figure 1:
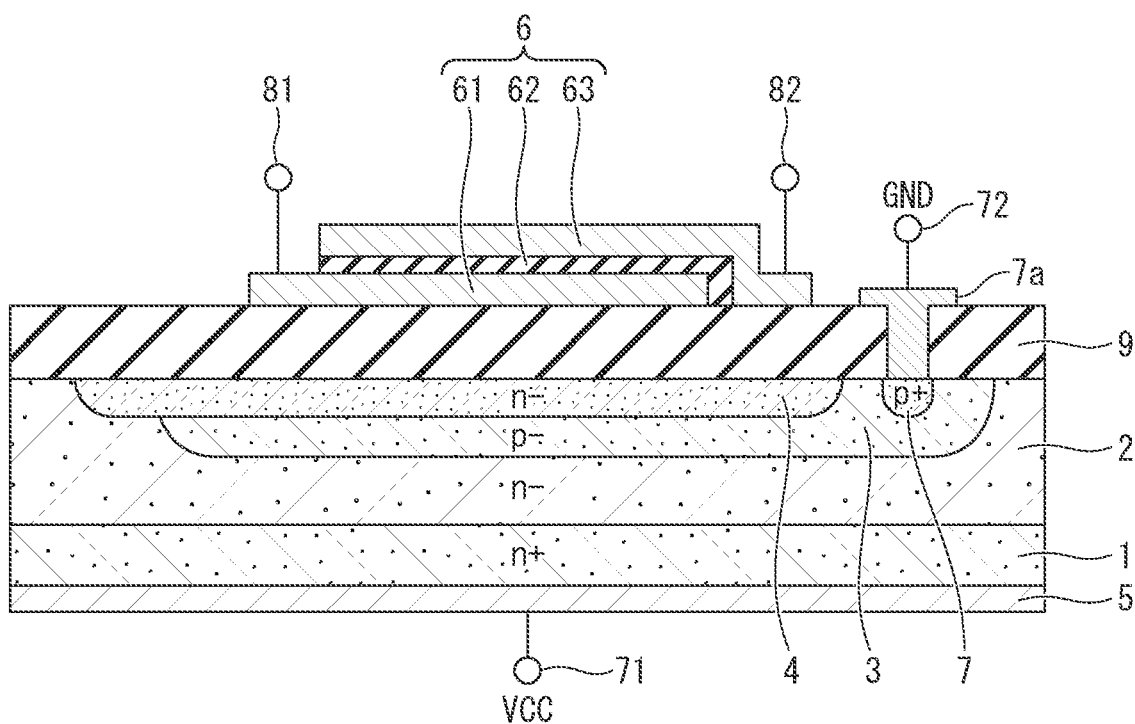
FIG. 1 is a cross-sectional view illustrating a semiconductor device according to a first embodiment.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the embodiment, a "first main electrode region" and a "second main electrode region" are a main electrode region of a semiconductor element, in which a main current flows in or out. The first main electrode region is assigned to a semiconductor region which is an emitter region or a collector region in an insulated-gate bipolar transistor (IGBT). The first main electrode region is assigned to a semiconductor region which is a source region or a drain region in a field-effect transistor (FET) or a static induction transistor (SIT). The first main electrode region is assigned to a semiconductor region which is an anode region or a cathode region in a static induction (SI) thyristor or a gate turn-off (GTO) thyristor. The second main electrode region is assigned to a semiconductor region which is not assigned as the first main electrode region and will be the emitter region or the collector region in the IGBT, the source region or the drain region in the FET or the SIT, and the anode region or the cathode region in the SI thyristor or the GTO thyristor. That is, when the first main electrode region is the source region, the second main electrode region means the drain region. When the first main electrode region is the emitter region, the second main electrode region means the collector region. When the first main electrode region is the anode region, the second main electrode region means the cathode region.

Further, definitions of directions such as an up-and-down direction such as "top surface" or "bottom surface" or right-and-left direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type. Further, a semiconductor region denoted by the symbol "n" or "p" attached with "+" indicates that such semiconductor region has a relatively high impurity concentration or a relatively low specific resistance as compared to a semiconductor region denoted by the symbol "n" or "p" without "+". A semiconductor region denoted by the symbol "n" or "p" attached with "−" indicates that such semiconductor region has a relatively low impurity concentration or a relatively high specific resistance as compared to a semiconductor region denoted by the symbol "n" or "p" without "−". However, even when the semiconductor regions are denoted by the same reference symbols "n" and "n", it is not indicated that the semiconductor regions have exactly the same impurity concentration or the same specific resistance.

First Embodiment

<Semiconductor Device>

A semiconductor device according to a first embodiment includes a semiconductor base body (1, 2) of a first conductivity-type (n-type), as illustrated in FIG. 1. The semiconductor base body (1, 2) includes a low specific resistance layer 1 of $n^+$-type, and a high specific resistance layer 2 of $n^-$-type deposited on the top surface of the low specific resistance layer 1 and having a lower impurity concentration and a higher specific resistance than the low specific resistance layer 1. The low specific resistance layer 1 is a semiconductor substrate (a Si wafer) made of silicon (Si), for example. The high specific resistance layer 2 is an epitaxially-grown layer made of Si and epitaxially grown on the low specific resistance layer 1. The semiconductor base body (1, 2) is illustrated below with a case of being made of a semiconductor material such as Si as a base material, but the base material is not limited to Si. The semiconductor base body (1, 2) may be configured such that the low specific resistance layer 1 that is an impurity-doped layer of $n^+$-type is formed by ion implantation or thermal diffusion on the bottom surface of the $n^-$-type semiconductor substrate (the Si wafer) serving as the high specific resistance layer 2.

The low specific resistance layer 1, when used as the semiconductor substrate, has an impurity concentration in a range of about $2 \times 10^{18}$ cm$^{-3}$ to $1 \times 10^{19}$ cm$^{-3}$, for example. In this case, an impurity concentration of the high specific resistance layer 2 can be determined within a range of about $1 \times 10^{12}$ cm$^{-3}$ to $1 \times 10^{16}$ cm$^{-3}$, and is herein set in a range of about $1 \times 10^{15}$ cm$^{-3}$ to $1 \times 10^{16}$ cm$^{-3}$, for example. When the low specific resistance layer 1 of the $n^+$-type impurity-doped layer is formed on the bottom surface of the high specific resistance layer 2 of the $n^-$-type semiconductor substrate, the impurity concentration of the low specific resistance layer 1 can be set in a range of about $5 \times 10^{18}$ cm$^{-3}$ to $1 \times 10^{21}$ cm$^{-3}$. The impurity concentration of the low specific resistance layer 1 is not necessarily constant, and can have an impurity profile increased to an impurity concentration as high as about $1 \times 10^{21}$ cm$^{-3}$ at the bottom surface of the low specific resistance layer 1. The low specific resistance layer 1 may have a composite structure including an upper layer of about $5 \times 10^{18}$ cm$^{-3}$ to $2 \times 10^{19}$ cm$^{-3}$ and a lower layer of about $3 \times 10^{19}$ cm$^{-3}$ to $1 \times 10^{21}$ cm$^{-3}$, for example.

A bottom-surface electrode (a rear-surface electrode) 5 is provided as a first electrode on the bottom surface of the low specific resistance layer 1. A first potential terminal (a VCC terminal) 71 on the high-potential side is connected to the bottom-surface electrode 5. A first potential is applied to the low specific resistance layer 1 from the first potential terminal 71 via the bottom-surface electrode 5. The first potential applied is a power supply potential (a VCC potential) of about 15 volts of a high-side power IC, for example.

A first semiconductor region 3 of a second conductivity-type ($p^-$-type) is selectively provided at an upper part of the high specific resistance layer 2. The first semiconductor region 3 is a diffusion layer formed such that p-type impurity ions are implanted to the high specific resistance layer 2 and are then subjected to annealing, for example. The first semiconductor region 3 is set to, but not necessarily have an impurity concentration of about $6 \times 10^{15}$ cm$^{-3}$, for example.

The first semiconductor region 3 may have the same impurity concentration as, may have a higher impurity concentration than, or may have a lower impurity concentration than the high specific resistance layer 2. The impurity concentration, the position, and the depth of the first semiconductor region 3, which are described in detail below, are regulated as appropriate so as to deplete a region under a passive element 6 during the operation of the semiconductor device according to the first embodiment.

A second semiconductor region 4 of $n^-$-type is selectively provided at an upper part of the first semiconductor region 3. The second semiconductor region 4 is a diffusion layer formed such that n-type impurity ions are implanted to the high specific resistance layer 2 and are then subjected to annealing, for example. The second semiconductor region 4 partly extends to the outside of the first semiconductor region 3 so as to be in contact with the high specific resistance layer 2. The second semiconductor region 4 thus has the same potential (the VCC potential) as the high specific resistance layer 2. The second semiconductor region 4 is set to, but not necessarily, have an impurity concentration of about $6 \times 10^{15}$ cm$^{-3}$, for example. The impurity concentration, the position, and the depth of the second semiconductor region 4, which are described in detail below, are regulated as appropriate so as to deplete the region under the passive element 6 during the operation of the semiconductor device according to the first embodiment.

An insulating film 9 is deposited on the top surfaces of the first semiconductor region 3 and the second semiconductor region 4. The insulating film 9 is a field oxide film such as a film of local oxidation of silicon (LOCOS) selectively (locally) formed by LOCOS, for example. The insulating film 9 may be any insulating film other than the field oxide film.

The insulating film 9 is provided with an opening. The opening of the insulating film 9 in the case of the LOCOS film may be selectively formed during the formation of the insulating film 9 or may be formed by dry etching after the formation of the insulating film 9. A contact region 7 of $p^+$-type deposited at the upper part of the first semiconductor region 3 and having a higher impurity concentration than the first semiconductor region 3 is exposed to the opening of the insulating film 9. An electrode 7a is provided as a second electrode inside the opening of the insulating film 9 and is in contact with the $p^+$-type contact region 7. The first semiconductor region 3 is electrically connected to a second potential terminal (a GND terminal) 72 on the low-potential side via the contact region 7. A ground potential (a GND potential), for example, is applied to the second potential terminal 72 as a second potential lower than the first potential (VCC) applied to the first potential terminal 71.

The passive element 6 is deposited as a PIP capacitive element on the top surface of the insulating film 9. The passive element 6 has a stacked structure including a first conductive layer (a lower electrode) 61 deposited on the top surface of the insulating film 9, a dielectric layer 62 deposited on the top surface of the first conductive layer 61, and a second conductive layer (an upper electrode) 63 deposited on the top surface of the dielectric layer 62. While FIG. 1 illustrates the case in which the right end of the dielectric layer 62 is in contact with the top surface of the insulating film 9, the dielectric layer 62 may be provided only on the top surface of the first conductive layer 61. While FIG. 1 also illustrates the case in which the right end of the second conductive layer 63 has a stepped part to be in contact with the top surface of the insulating film 9, the second conductive layer 63 may be provided only on the top surface of the dielectric layer 62.

The first conductive layer 61 and the second conductive layer 63 are each formed of polysilicon with which impurity ions are heavily doped. The first conductive layer 61 and the second conductive layer 63 may have the same impurity concentration, or may have different impurity concentrations. The dielectric layer 62 is an insulating film such as a high-temperature oxide (HTO) film, for example. A first terminal 81 is connected to the first conductive layer 61, and a second terminal 82 is connected to the second conductive layer 63. The first terminal 81 and the second terminal 82 used are connected to predetermined positions inside the circuit so as to achieve intended circuit identification.

The ends on both sides of each of the second semiconductor region 4 and the first semiconductor region 3 under the passive element 6 are located on the outside of the ends on both sides of each of the first conductive layer 61 and the second conductive layer 63 of the passive element 6. The ends on both sides of each of the second semiconductor region 4 and the first semiconductor region 3 may be located on the inside of the ends on both sides of each of the first conductive layer 61 and the second conductive layer 63 of the passive element 6 instead.

Figure 2:
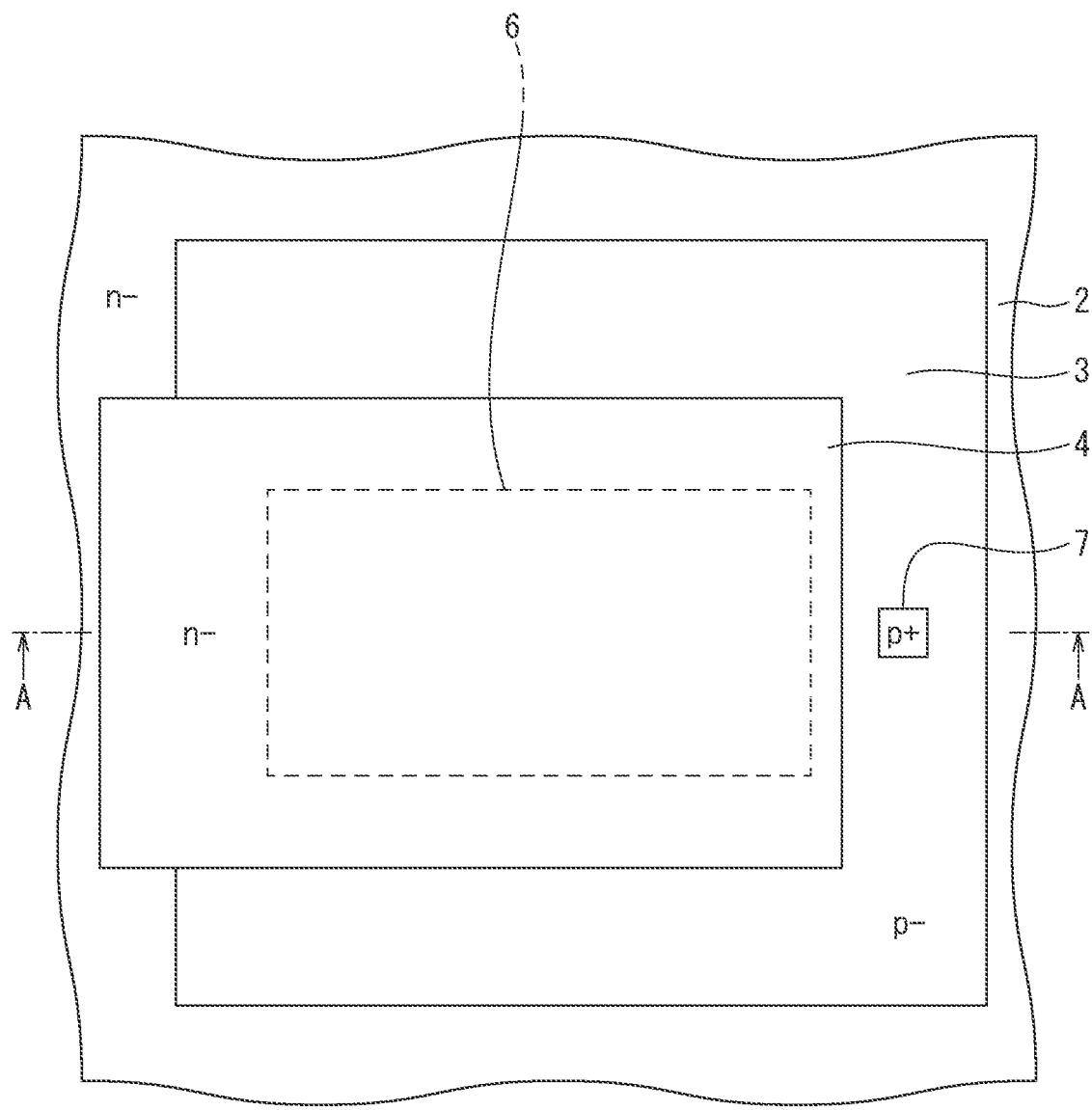
FIG. 2 is a plan view illustrating a semiconductor base body of the semiconductor device according to the first embodiment.

FIG. 2 illustrates an example of a planar layout of the semiconductor base body (1, 2) as viewed from above. FIG. 2 schematically indicates the position of the passive element 6 by the broken line deposited on the second semiconductor region 4 via the insulating film 9. The first semiconductor region 3 and the second semiconductor region 4 are each illustrated with a case of having a rectangular planar pattern, but are not limited to this case. The first semiconductor region 3 and the second semiconductor region 4 are each arranged to overlap with the passive element 6 and cover the entire passive element 6 in the planar pattern. The first semiconductor region 3 and the second semiconductor region 4 may each be arranged to not entirely but partly cover the passive element 6 in the planar pattern.

Figure 3:
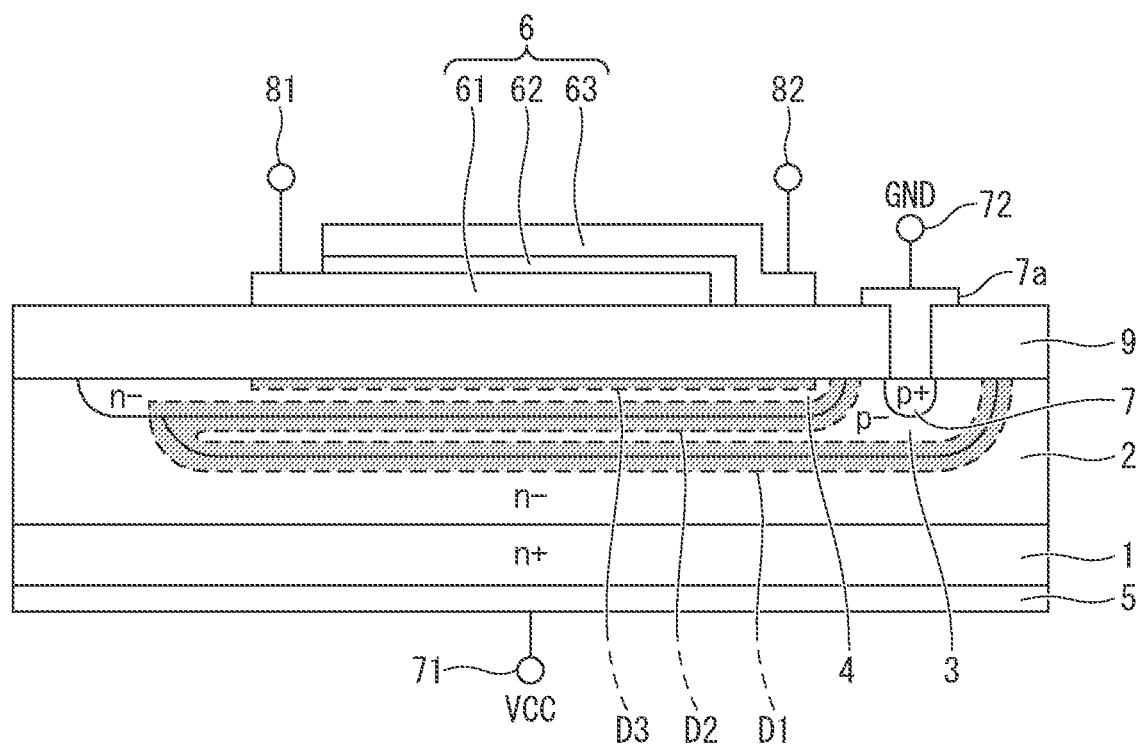
FIG. 3 is a cross-sectional view illustrating a spread of depletion layers in the semiconductor device according to the first embodiment.

FIG. 3 schematically illustrates a spread of depletion layers D1, D2, and D3 in the semiconductor device according to the first embodiment when a voltage lower than the VCC potential for normal operation and higher than the GND potential (such as about five volts) is applied as the first potential to the first potential terminal 71, and the GND potential is applied as the second potential to the second potential terminal 72. As illustrated in FIG. 3, the depletion layer D1 spreads toward both the high specific resistance layer 2 and the first semiconductor region 3 from the p-n junction between the high specific resistance layer 2 and the first semiconductor region 3. The second semiconductor region 4, which is in contact with the high specific resistance layer 2, is led to have a high potential, so that the depletion layer D2 also spreads toward both the first semiconductor region 3 and the second semiconductor region 4 from the p-n junction between the first semiconductor region 3 and the second semiconductor region 4. The depletion layer D3 also spreads toward the second semiconductor region 4 from the junction between the second semiconductor region 4 and the insulating film 9.

Figure 4:
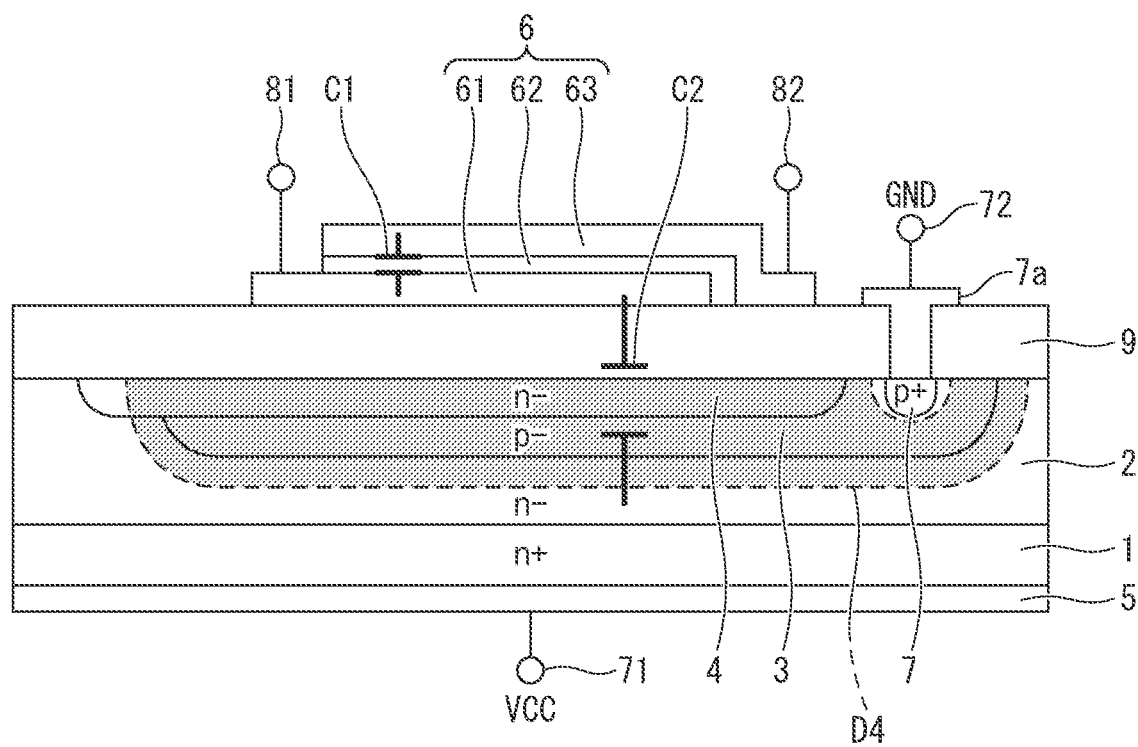
FIG. 4 is another cross-sectional view illustrating the spread of the depletion layers in the semiconductor device according to the first embodiment.

FIG. 4 schematically illustrates a spread of a depletion layer D4 in the semiconductor device according to the first embodiment when the VCC potential for normal operation (such as about 13 volts) is applied as the first potential to the first potential terminal 71, and the GND potential is applied as the second potential to the second potential terminal 72. FIG. 4 schematically indicates a capacitance C1 formed by the passive element 6 as the PIP capacitive element and a parasitic capacitance C2 connected to the passive element 6 by the circuit signs.

As illustrated in FIG. 4, the respective depletion layers D1, D2, and D3 illustrated in FIG. 3 further spread to be connected to each other to form the depletion layer D4, so as to substantially or completely deplete the region including the second semiconductor region 4 and the first semiconductor region 3 immediately below the passive element 6. The positions, the junction depths, and the impurity concentrations of the semiconductor base body (1, 2), the first semiconductor region 3, and the second semiconductor region 4 are regulated as appropriate, so as to substantially or completely deplete the region including the first semiconductor region 3 and the second semiconductor region 4 immediately below the passive element 6, as illustrated in FIG. 4, when the predetermined first potential and second potential are applied. This can reduce the parasitic capacitance connected to the passive element 6, so as to suppress an error operation of the circuit. The region including the first semiconductor region 3 and the second semiconductor region 4 immediately below the passive element 6 is not necessarily completely depleted, and the present embodiment can also achieve the effect of reducing the parasitic capacitance regardless of the complete depletion.

On the assumption that the high specific resistance layer 2, the first semiconductor region 3, and the second semiconductor region 4 each have a flat concentration profile with an average concentration of $6\times10^{15}$ cm$^{-3}$, for example, a width of the depletion layer spreading from the respective junctions between the high specific resistance layer 2, the first semiconductor region 3, and the second semiconductor region 4 is about 1.2 μm when a voltage of 13 volts which is a standard battery voltage of vehicles is applied between the first potential terminal 71 and the second potential terminal 72. In view of this, the first semiconductor region 3 and the second semiconductor region 4 are formed such that the depth of the second semiconductor region 4 is less than 1.2 μm and the width of the first semiconductor region 3 interposed between the high specific resistance layer 2 and the second semiconductor region 4 is less than 2.4 μm, so as to achieve the complete depletion.

Figure 5:
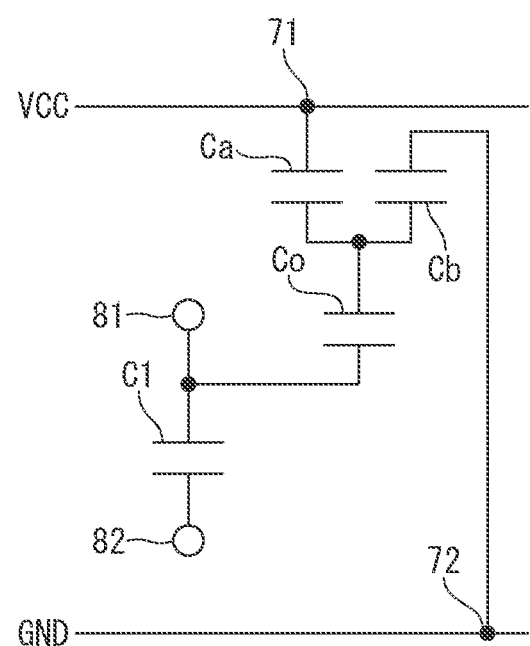
FIG. 5 is a circuit diagram of the semiconductor device according to the first embodiment.

FIG. 5 is an equivalent circuit diagram of the semiconductor device according to the first embodiment. As illustrated in FIG. 5, an oxide film capacitance Co by the insulating film 9 is connected to the capacitance C1 of the passive element 6. A depletion layer capacitance Ca is connected between the oxide film capacitance Co and the VCC potential, and a depletion layer capacitance Cb is connected between the oxide film capacitance Co and the GND potential. A parasitic capacitance Cvcc connected to the VCC potential and a parasitic capacitance Cgnd connected to the GND potential are given as follows:

$$Cvcc \approx Ca/(Co+Ca) \times Co(\ll Co) \quad (1)$$

$$Cgnd \approx Cb/(Co+Ca) \times Co(\ll Co) \quad (2)$$

In the semiconductor device according to the first embodiment, the depletion layer capacitances Ca and Cb are connected in series to the oxide film capacitance Co, so as to reduce the combined parasitic capacitances Cvcc and Cgnd more than the oxide film capacitance Co. When the thickness of the insulating film 9 is set to 0.3 μm, the oxide film capacitance Co is 0.11 fF/μm$^2$. The respective depletion layer capacitances Ca and Cb are 0.04 fF/μm$^2$ when the voltage of 13 volts is applied to the junction between the second semiconductor region 4 having the average impurity concentration of $6\times10^{15}$ cm$^{-3}$ and the first semiconductor region 3 having the average impurity concentration of $6\times10^{15}$ cm$^{-3}$. Since the semiconductor device according to the first embodiment has the structure that leads the depletion layers to spread more than a simple p-n junction, the depletion layer capacitances Ca and Cb can be estimated to be smaller than 0.04 fF/μm$^2$. The series-combined capacitances Cvcc and Cgnd of the oxide film capacitance Co and the depletion layer capacitances Ca and Cb thus can be estimated to be at least a fourth of the independent oxide film capacitance Co. The depletion layer capacitances Ca and Cb are presumed to be reduced more than that described above, since the planar distances are actually added as distances to the terminals.

First Comparative Example

Figure 6:
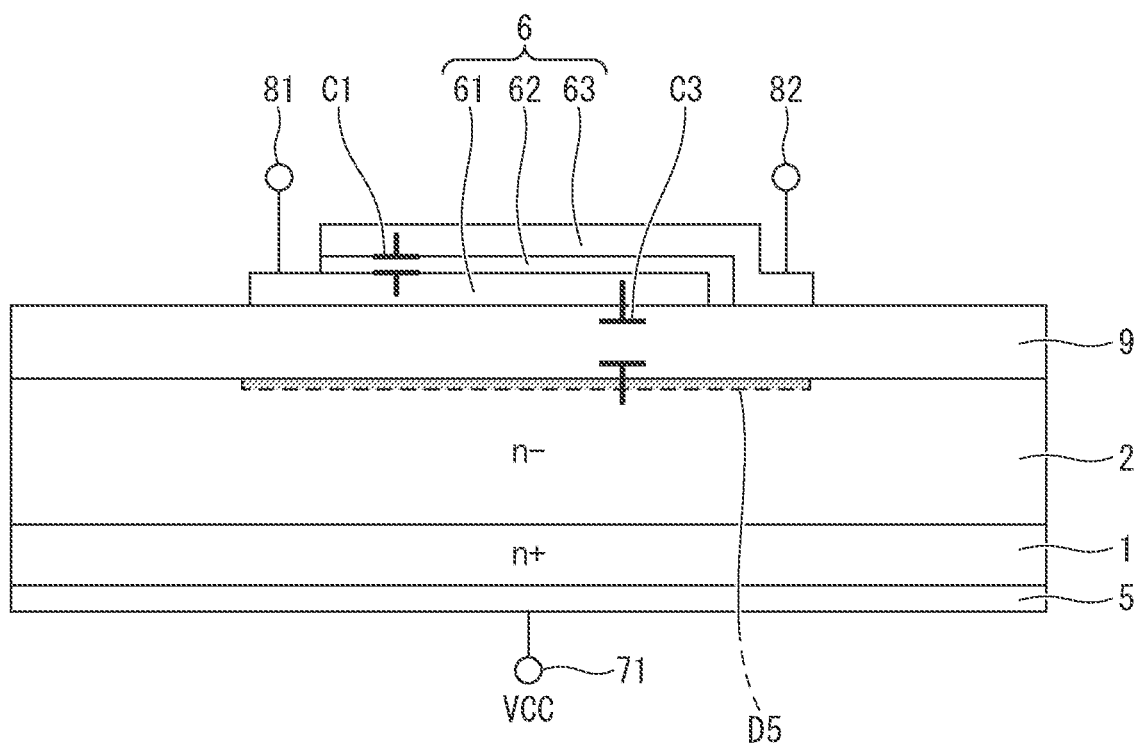
FIG. 6 is a cross-sectional view illustrating a semiconductor device of a first comparative example.

A semiconductor device of a first comparative example is described below. The semiconductor device of the first comparative example differs from the semiconductor device according to the first embodiment illustrated in FIG. 1 in that either the first semiconductor region 3 or the second semiconductor region 4 illustrated in FIG. 1 is not provided at the upper part of the high specific resistance layer 2, as illustrated in FIG. 6. The passive element 6 is provided on the high specific resistance layer 2 via the insulating film 9.

Figure 7:
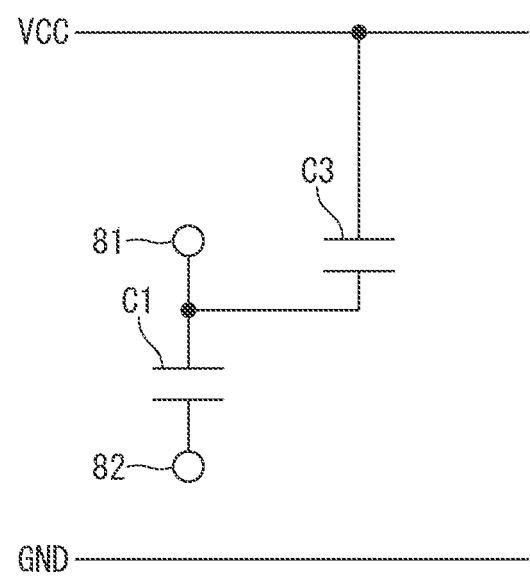
FIG. 7 is a circuit diagram of the semiconductor device of the first comparative example.

FIG. 6 schematically illustrates the capacitance C1 of the passive element 6, a parasitic capacitance C3 connected to the passive element 6, and a depletion layer D5 formed when the first potential (the VCC potential) is applied to the first potential terminal 71. The parasitic capacitance C3 is composed of the high specific resistance layer 2, the depletion layer D5, the insulating film 9, and the first conductive layer 61. As illustrated in FIG. 7, the parasitic capacitance C3 is connected between the first terminal 81 of the passive element 6 and the VCC potential, which can be a cause of an error operation of the circuit.

Second Comparative Example

Figure 8:
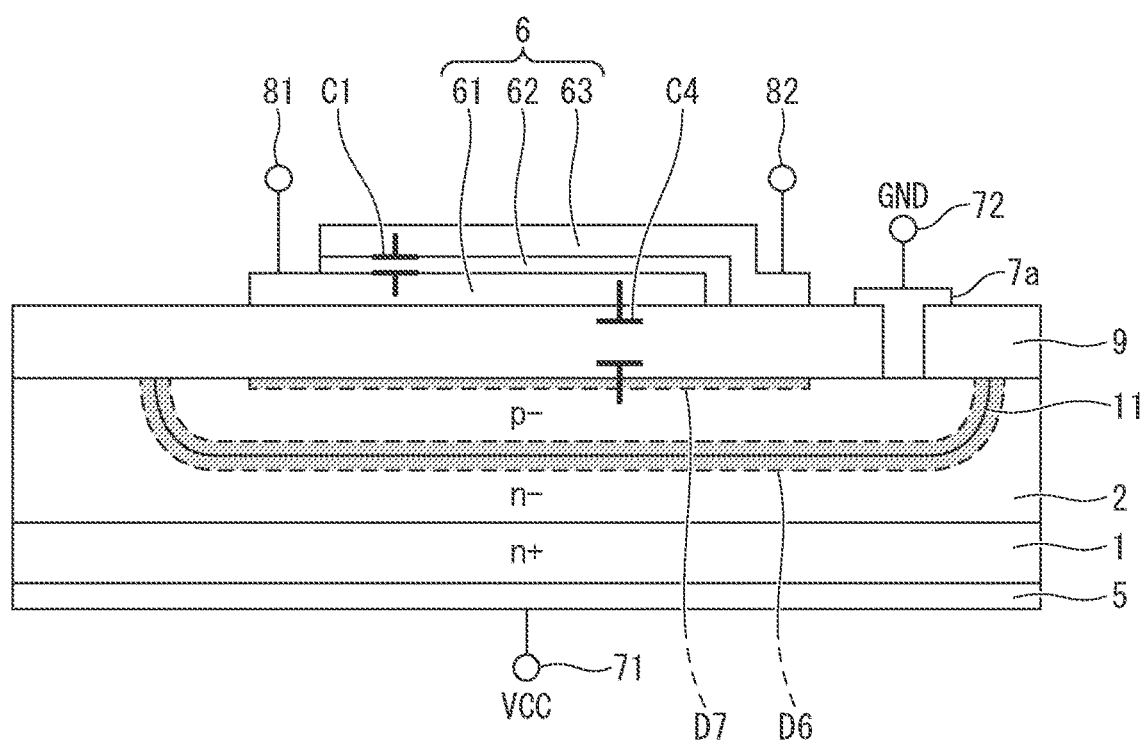
FIG. 8 is a cross-sectional view illustrating a semiconductor device of a second comparative example.

A semiconductor device of a second comparative example is described below. The semiconductor device of the second comparative example differs from the semiconductor device according to the first embodiment illustrated in FIG. 1 in that a semiconductor region 11 of p$^-$-type is only provided at the upper part of the high specific resistance layer 2, as illustrated in FIG. 8. The second potential terminal 72 is connected to the semiconductor region 11. The passive element 6 is deposited on the top surface of the semiconductor region 11 via the insulating film 9.

FIG. 8 schematically illustrates the capacitance C1 of the passive element 6, a parasitic capacitance C4 connected to the passive element 6, and depletion layers D6 and D7 formed when the VCC potential is applied to the first potential terminal 71 and the GND potential is applied to the second terminal 72. The parasitic capacitance C4 is composed of the semiconductor region 11, the depletion layers D6 and D7, the insulating film 9, and the first conductive layer 61.

Figure 9:
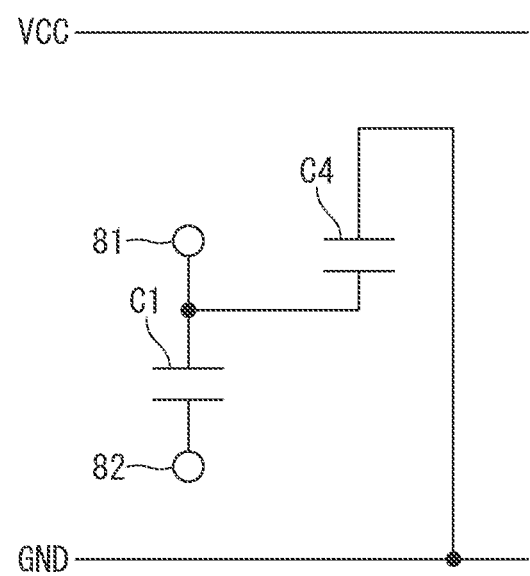
FIG. 9 is a circuit diagram of the semiconductor device of the second comparative example.

The semiconductor device of the second comparative example is provided with the p$^-$-type semiconductor region 11 that is a reverse conducting type of the n$^-$-type high specific resistance layer 2 and is led to the GND potential so as to be electrically isolated from the high specific resistance layer 2 of the VCC potential. However, as illustrated in FIG. 9, the parasitic capacitance C4 is connected between the first terminal 81 of the passive element 6 and the GND potential, which can be a cause of an error operation of the circuit.

In the semiconductor device of the second comparative example, the p⁻-type semiconductor region 11 would be presumed to be led to a floating potential without being connected with the second potential terminal 72. Since the potential of the semiconductor region 11 in this case tends to be influenced by a charge in the insulating film 9 or a charge in the package, the characteristics may fluctuate because of the influence of a movable charge that moves upon voltage application for a long period of time, increasing a risk of decreasing the reliability.

In contrast to the first and second comparative examples, the semiconductor device according to the first embodiment has the configuration as illustrated in FIG. 1 in which the p⁻-type first semiconductor region 3 and the n⁻-type second semiconductor region 4 are arranged to overlap with each other under the insulating film 9 on which the passive element 6 as the PIP capacitive element is deposited, and the first potential of a high potential is applied to the second semiconductor region 4 and the second potential of a low potential is applied to the first semiconductor region 3, so as to promote the depletion of the first semiconductor region 3 and the second semiconductor region 4, and reduce the depletion layer capacitance accordingly. The semiconductor device according to the first embodiment thus can reduce the parasitic capacitance connected to the passive element 6, and suppress an error operation of the circuit connected to the passive element 6.

<Semiconductor Integrated Circuit>

A semiconductor integrated circuit to which the semiconductor device according to the first embodiment is applied is illustrated below with a high-side power IC. The semiconductor integrated circuit according to the first embodiment is a power IC including an output part 100 and a circuit part 200 that are monolithically integrated in a single semiconductor chip, as illustrated in FIG. 10.

Figure 10:
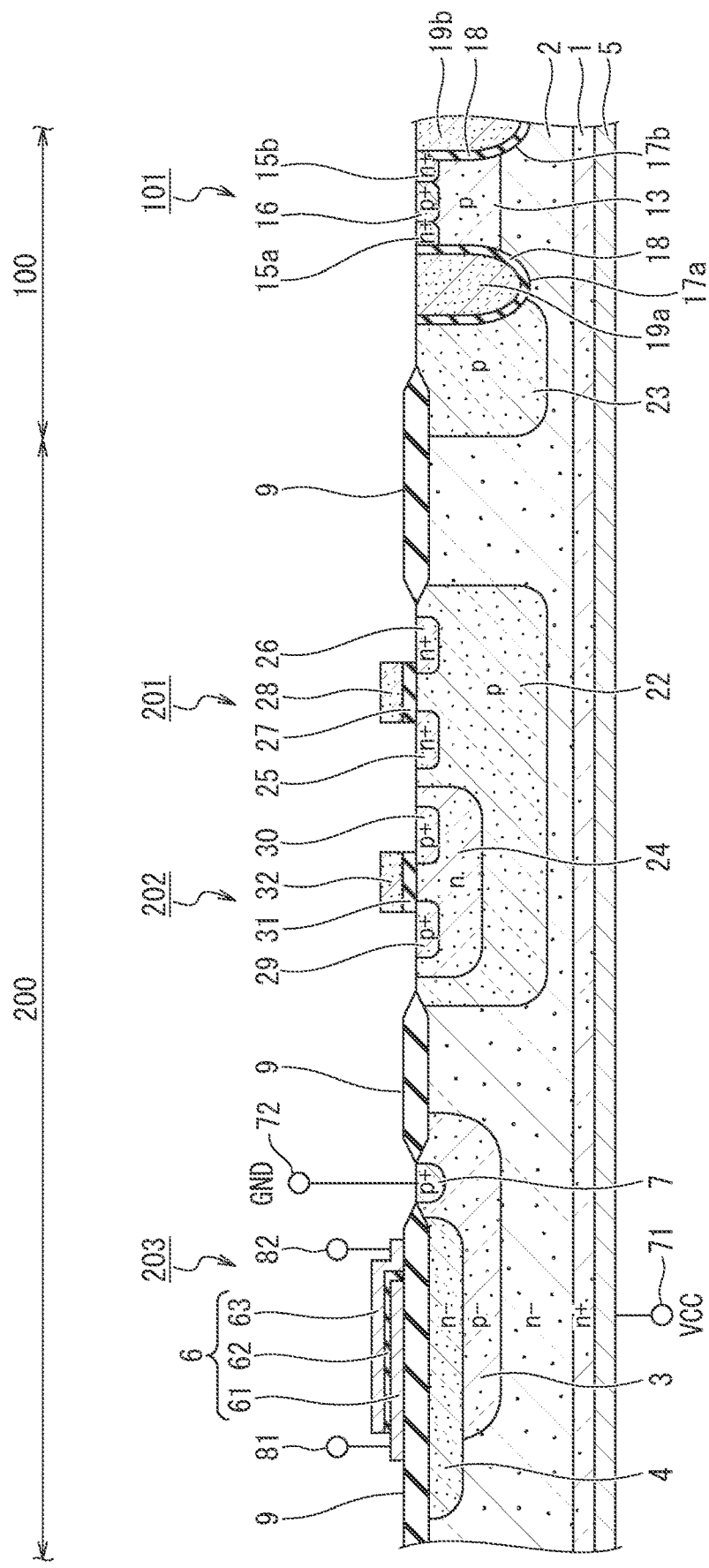
FIG. 10 is a cross-sectional view illustrating a semiconductor integrated circuit according to the first embodiment.

As illustrated on the right side in FIG. 10, an output-stage element 101 is illustrated with a vertical n-channel trench-gate MOSFET as a power semiconductor element integrated in the output part 100. A part of the low specific resistance layer 1 serves as a first main electrode region (a drain region) of the output-stage element 101, and a part of the high specific resistance layer 2 located on the first main electrode region serves as a drift layer of the output-stage element 101. The bottom-surface electrode 5 is deposited as a drain electrode on the bottom surface of the low specific resistance layer 1. The bottom-surface electrode 5 is connected to the first potential terminal 71 that is a power supply terminal. The power supply potential (the VCC potential) of about 13 volts, for example, is applied as the first potential to the first potential terminal 71.

A body region (a base region) 13 of the second conductivity-type (p-type) is provided partly at the upper part of the high specific resistance layer 2 located on the output part 100 side. Second main electrode regions (source regions) 15a and 15b of n⁺-type having a higher impurity concentration than the high specific resistance layer 2 are selectively provided at the upper part of the body region 13. A base contact region 16 of p⁺-type is electively provided in contact with the source regions 15a and 15b at the upper part of the body region 13.

In view of the unit cell in FIG. 10, a pair of trenches 17a and 17b opposed to each other is dug from the upper surface of the body region 13. The respective trenches 17a and 17b have a greater depth than the body region 13 with at least part of the side surfaces in contact with the body region 13.

FIG. 10 illustrates the cross section visually provided with the pair of the trenches 17a and 17b, but the semiconductor integrated circuit may actually be provided with a single trench having a looped planar shape continuous in the front-rear direction of the sheet of FIG. 10. A well region 23 of p-type (a p-well) provided partly at the upper part of the high specific resistance layer 2 is in contact with the trench 17a.

A gate insulating film 18 is provided along the inner surface of the respective trenches 17a and 17b. Gate electrodes 19a and 19b are buried in the trenches 17a and 17b via the gate insulating films 18 to form trench control electrode structures (18, 19a) and (18, 19b).

The gate insulating films 18 as used herein can be a silicon oxide film (a $SiO_2$ film), for example, and other examples other than the $SiO_2$ film include a silicon oxynitride (SiON) film, a strontium oxide (SrO) film, a silicon nitride ($Si_3N_4$) film, and an aluminum oxide ($Al_2O_3$) film. Still other examples include a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film. Further, two or more of these single layers may be chosen and stacked on one another so as to be used as a composite film.

The material used for the gate electrodes 19a and 19b may be polysilicon (doped polysilicon) with which n-type impurity ions or p-type impurity ions are heavily doped, and other examples other than the doped polysilicon (DOPOS) include a refractory metal such as tungsten (W), molybdenum (Mo), and titanium (Ti), and silicide of the refractory metal and the polysilicon. The material used for the gate electrodes 19a and 19b may also be polycide which is a composite film of the polysilicon and the silicide of the refractory metal.

The gate electrodes 19a and 19b electrostatically control a surface potential of the body region 13 on the side surface side of the respective trenches 17a and 17b via the gate insulating films 18, so as to form an inversion channel in the body region 13 on the side surface side of the respective trenches 17a and 17b. In the output-stage element 101, a main current flows between the source regions 15a and 15b on the upper side and the drain region that is a part of the low specific resistance layer 1 on the lower side opposed to the source regions 15a and 15b via the inversion channel.

As illustrated in the middle in FIG. 10, the circuit part 200 includes circuit elements 201 and 202 configured to control the output-stage element 101. The circuit part 200 as used herein can be a complementary MOS (CMOS) including the circuit element 201 that is a horizontal n-channel MOSFET and the circuit element 202 that is a horizontal p-channel MOSFET, for example. The circuit element 201 is arranged in a p-type well (a p-well) 22 deposited at the upper part of the high specific resistance layer 2. The p-wells 22 and 23 each have an impurity concentration of about $1 \times 10^{16}$ $cm^{-3}$, for example.

The circuit element 201 includes a first main electrode region (a source region) 25 of n⁺-type and a second main electrode region (a drain region) 26 of n⁺-type opposed to each other at the upper part of the p-well 22. The source region 25 and the drain region 26 are selectively provided separately from each other, and each have a higher impurity concentration than the high specific resistance layer 2.

A flat control electrode structure (27, 28) extends in the lateral direction on the p-well 22. The control electrode structure (27, 28) includes a gate insulating film 27 deposited on the p-well 22 between the source region 25 and the drain region 26, and a gate electrode 28 deposited on the gate insulating film 27. The gate electrode 28 electrostatically controls a surface potential of the p-well 22 via the gate insulating film 27 so as to form an inversion channel in the surface layer of the p-well 22.

The circuit element 202 is arranged in an n-type well (an n-well) 24 deposited at the upper part of the p-well 22. The n-well 24 has an impurity concentration of about $1 \times 10^{17}$ cm$^{-3}$, for example. The impurity concentration of the n-well 24 may be lower than the impurity concentration of the high specific resistance layer 2. The circuit element 202 includes a first main electrode region (a source region) 29 of p$^+$-type and a second main electrode region (a drain region) 30 of p$^+$-type opposed to each other at the upper part of the n-well 24. The source region 29 and the drain region 30 are selectively provided separately from each other, and each have a higher impurity concentration than the p-well 22.

A flat control electrode structure (31, 32) extends in the lateral direction on the n-well 24. The control electrode structure (31, 32) includes a gate insulating film 31 deposited on the n-well 24 between the source region 29 and the drain region 30, and a gate electrode 32 deposited on the gate insulating film 31. The gate electrode 32 electrostatically controls a surface potential of the n-well 24 via the gate insulating film 31 so as to form an inversion channel in the surface layer of the n-well 24. The insulating film 9 is selectively provided as a field oxide film such as a LOCOS film between the circuit element 201, the circuit element 202, and the output-stage element 101, for example, on the top surface of the high specific resistance layer 2.

As illustrated on the left side in FIG. 10, the circuit part 200 is provided with the structure of the semiconductor device 203 according to the first embodiment. The semiconductor device 203 includes the p$^-$-type first semiconductor region 3 selectively provided at the upper part of the high specific resistance layer 2, and the n$^-$-type second semiconductor region 4 selectively provided at the upper part of the first semiconductor region 3. The first semiconductor region 3 may have the same depth and impurity concentration as the body region 13 and the p-well region 23 in the output part 100 or the p-well 22 in the circuit part 200, and may be formed through the same process as the body region 13 and the p-well region 23 in the output part 100 or the p-well 22 in the circuit part 200, for example. The second semiconductor region 4 may have the same depth and impurity concentration as the n-well 24 in the circuit part 200, and may be formed through the same process as the n-well 24 in the circuit part 200, for example.

The insulating film 9 is deposited on the top surfaces of the first semiconductor region 3 and the second semiconductor region 4. The opening of the insulating film 9 is electrically connected to the second potential terminal (the GND terminal) 72 via the p$^+$-type contact region 7. The second potential (the GND potential) is applied to the second potential terminal 72.

The passive element 6 as the PIP capacitive element is deposited on the top surface of the insulating film 9. The passive element 6 has the stacked structure including the first conductive layer 61 deposited on the top surface of the insulating film 9, the dielectric layer 62 deposited on the top surface of the first conductive layer 61, and the second conductive layer 63 deposited on the top surface of the dielectric layer 62. The first terminal 81 is connected to the first conductive layer 61, and the second terminal 82 is connected to the second conductive layer 63.

Figure 11:
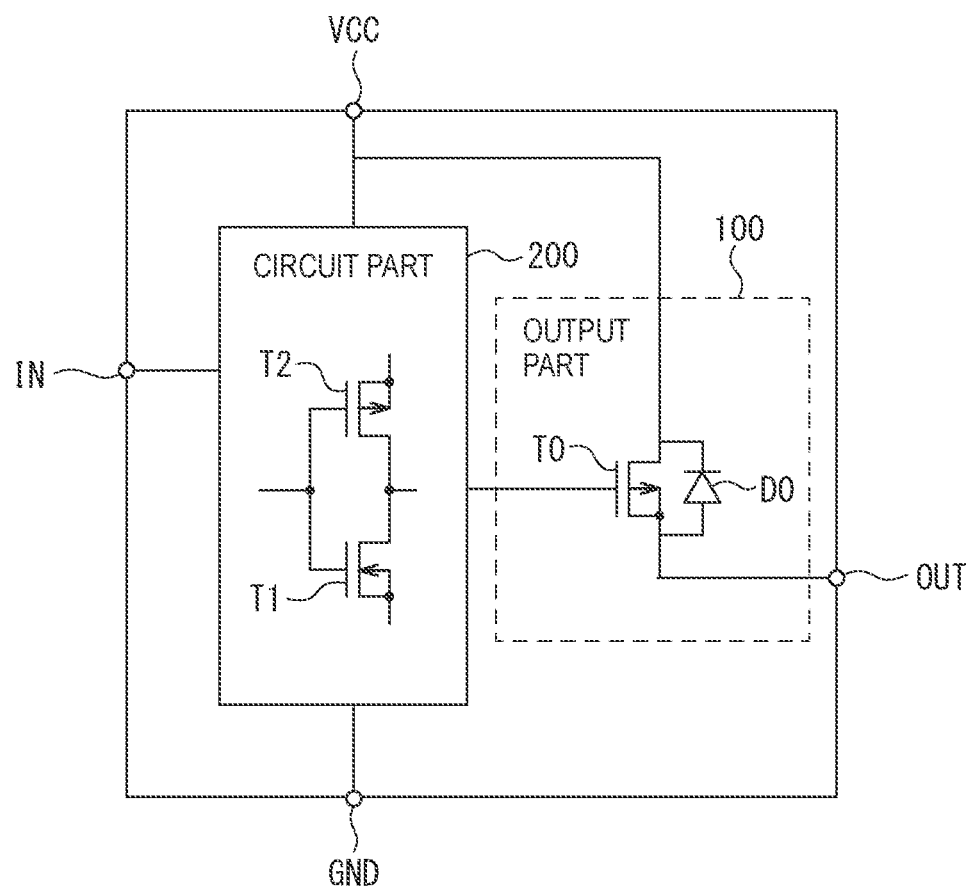
FIG. 11 is a circuit diagram of the semiconductor integrated circuit according to the first embodiment.

FIG. 11 is an equivalent circuit diagram of the semiconductor integrated circuit according to the first embodiment. The semiconductor integrated circuit according to the first embodiment includes the output part 100 and the circuit part 200, as illustrated in FIG. 11. The circuit elements 201 and 202 illustrated in FIG. 10 correspond to MOS transistors T1 and T2 included in the circuit part 200 illustrated in FIG. 11. The respective MOS transistors T1 and T2 correspond to part of the control circuit configured to control the output part 100, for example. The output-stage element 101 illustrated in FIG. 10 corresponds to a MOS transistor T0 of the output part 100 illustrated in FIG. 11. A freewheeling diode D0 is connected to the MOS transistor T0. A source terminal of the MOS transistor T0 is connected to an output terminal OUT, and a drain terminal of the MOS transistor T0 is connected to the first potential terminal (the power supply terminal) VCC. The semiconductor device 203 illustrated in FIG. 10 is included in the circuit part 200, although not illustrated in FIG. 11.

The semiconductor integrated circuit according to the first embodiment, which uses the structure of the semiconductor device 203 in the power IC in which the output part 100 and the circuit part 200 are packaged together, can reduce the parasitic capacitance of the passive element 6 of the semiconductor device 203, so as to suppress an error operation of the circuit part 200 connected to the passive element 6. In addition, the p$^-$-type first semiconductor region 3 and the n$^-$-type second semiconductor region 4 are formed in the same process as the other semiconductor regions in the output part 100 or the circuit part 200 in the case of the application of the structure of the semiconductor device 203, so as to avoid an increase in manufacturing steps.

Second Embodiment

Figure 12:
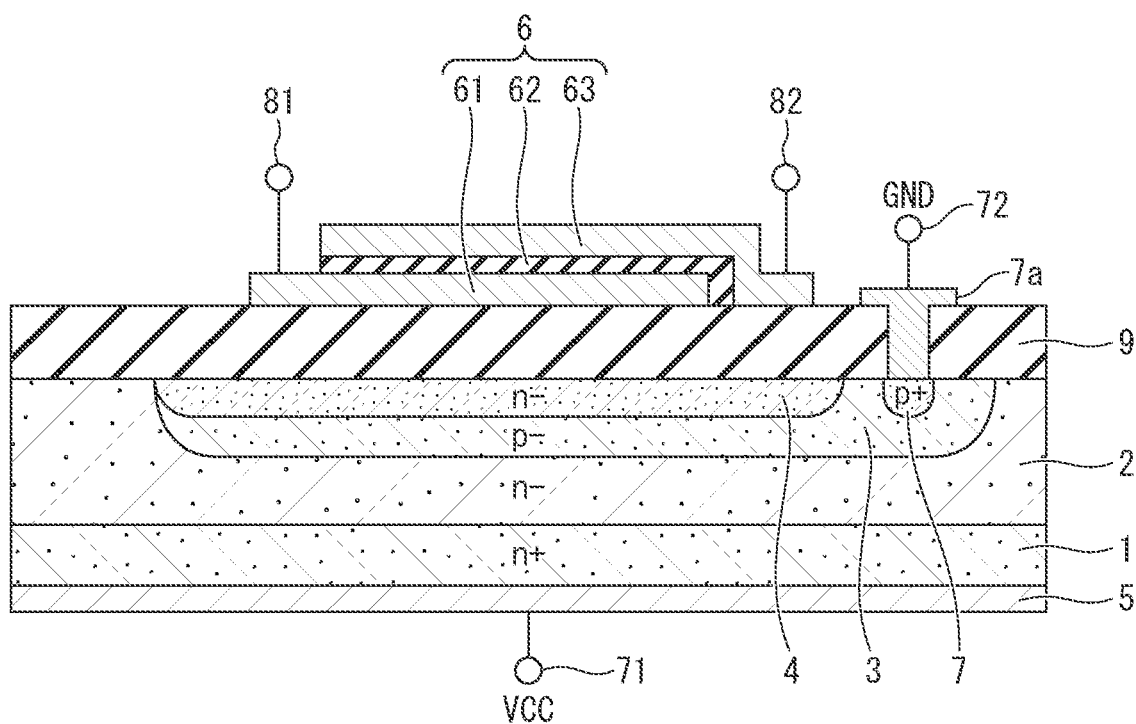
FIG. 12 is a cross-sectional view illustrating a semiconductor device according to a second embodiment.

A semiconductor device according to a second embodiment differs from the semiconductor device according to the first embodiment illustrated in FIG. 1 in that a part of the n$^-$-type second semiconductor region 4 does not extend to the outside of the type first semiconductor region 3, but the side surface of the second semiconductor region 4 on the left side conforms to the side surface of the first semiconductor region 3 on the left side, as illustrated in FIG. 12. The side surface of the second semiconductor region 4 on the left side is in contact with the n$^-$-type high specific resistance layer 2. The other configurations of the semiconductor device according to the second embodiment are the same as those of the semiconductor device according to the first embodiment, and overlapping explanations are not repeated below.

The semiconductor device according to the second embodiment can achieve the effects similar to those of the semiconductor device according to the first embodiment when a part of the n$^-$-type second semiconductor region 4 is in contact with the n$^-$-type high specific resistance layer 2 regardless of whether to extend to the outside of the type first semiconductor region 3.

Third Embodiment

Figure 13:
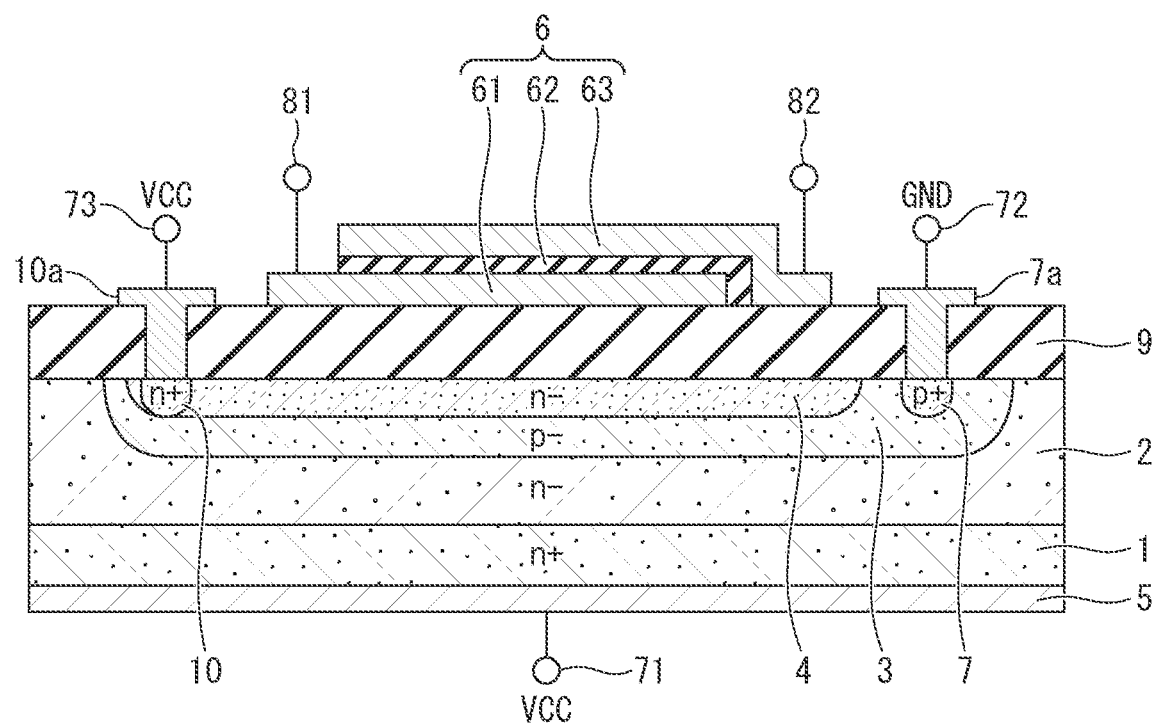
FIG. 13 is a cross-sectional view illustrating a semiconductor device according to a third embodiment.

A semiconductor device according to a third embodiment differs from the semiconductor device according to the first embodiment illustrated in FIG. 1 in that the n$^-$-type second semiconductor region 4 is provided inside the p$^-$-type first semiconductor region 3, as illustrated in FIG. 13. A contact region 10 of n$^+$-type having a higher impurity concentration than the second semiconductor region 4 is provided inside the second semiconductor region 4. An electrode 10a as a third electrode provided in an opening of the insulating film 9 is in contact with the n$^+$-type contact region 10. A third potential terminal 73 is connected to the electrode 10a. A potential higher than the second potential is applied as a third potential to the third potential terminal 73. The third potential applied may be the same VCC potential as the first potential applied to the first potential terminal 71, for example. The other configurations of the semiconductor device according to the third embodiment are the same as those of the semiconductor device according to the first embodiment, and overlapping explanations are not repeated below.

In the semiconductor device according to the third embodiment, the VCC potential is applied to the n⁻-type second semiconductor region 4 via the third potential terminal 73 when the second semiconductor region 4 is provided in the p⁻-type first semiconductor region 3, so as to lead the second semiconductor region 4 to have the same potential as the semiconductor base body (1, 2). The semiconductor device according to the third embodiment thus can achieve the effects similar to those of the semiconductor device according to the first embodiment.

Fourth Embodiment

Figure 14:
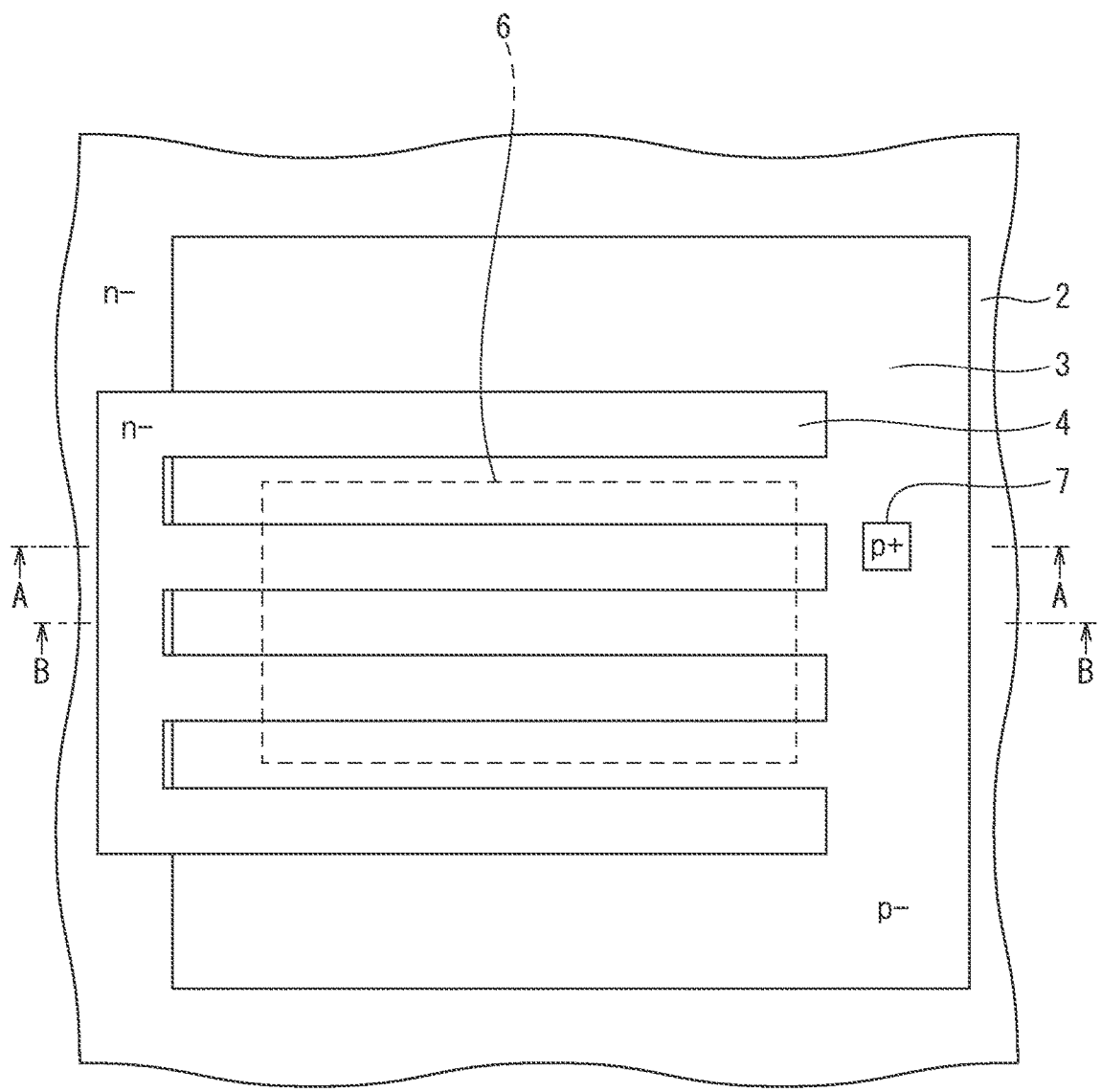
FIG. 14 is a plan view illustrating a semiconductor device according to a fourth embodiment.

A semiconductor device according to a fourth embodiment differs from the semiconductor device according to the first embodiment illustrated in FIG. 2 in the planar layout in which the second semiconductor region 4 has a comb-shaped planar pattern, as illustrated in FIG. 14. The stripe-shaped planar pattern (the striped part) corresponding to the teeth of the comb-like shape of the second semiconductor region 4 extends parallel to each other and overlaps with the first semiconductor region 3.

Figure 15:
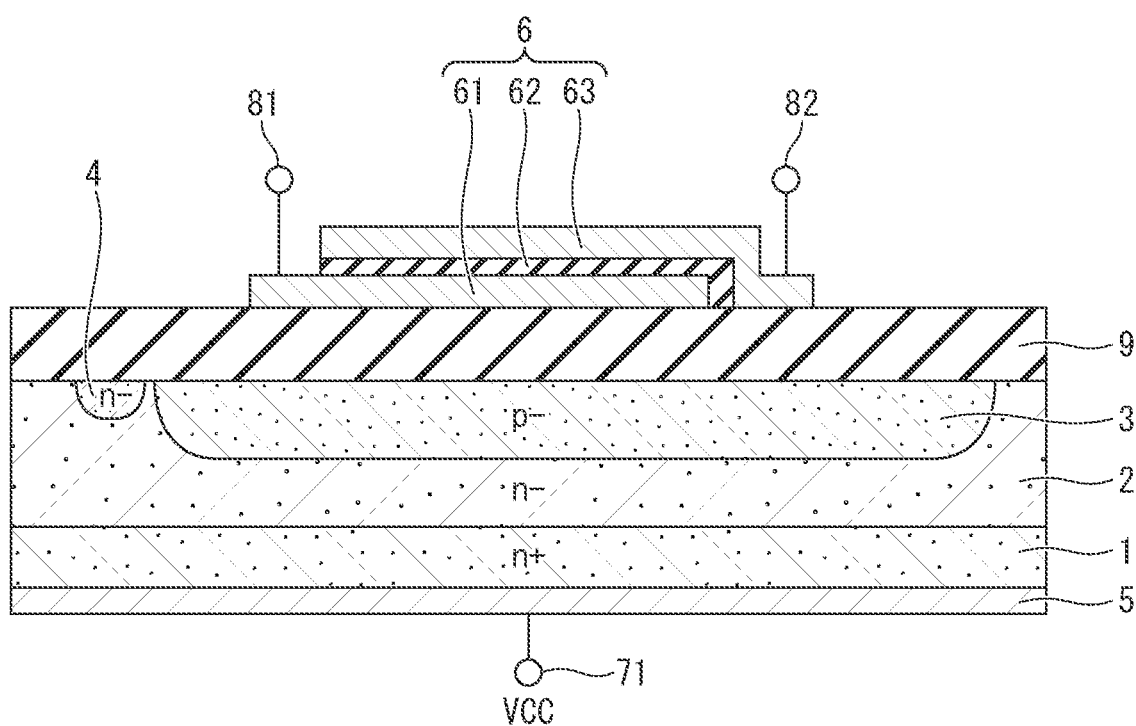
FIG. 15 is a cross-sectional view as viewed from direction B-B in FIG. 14.

The cross section as viewed from direction A-A in FIG. 14 passing through a part of the teeth of the comb-like shape of the second semiconductor region 4 corresponds to FIG. 1. The cross section as viewed from direction B-B in FIG. 14 not passing through a part of the teeth of the comb-like shape of the second semiconductor region 4 corresponds to FIG. 15. The other configurations of the semiconductor device according to the fourth embodiment are the same as those of the semiconductor device according to the first embodiment, and overlapping explanations are not repeated below.

The semiconductor device according to the fourth embodiment, which includes the second semiconductor region 4 having the comb-like planar pattern, can increase the junction area between the second semiconductor region 4 and the first semiconductor region 3, so as to facilitate the complete depletion in the region immediately under the passive element 6.

Fifth Embodiment

Figure 16:
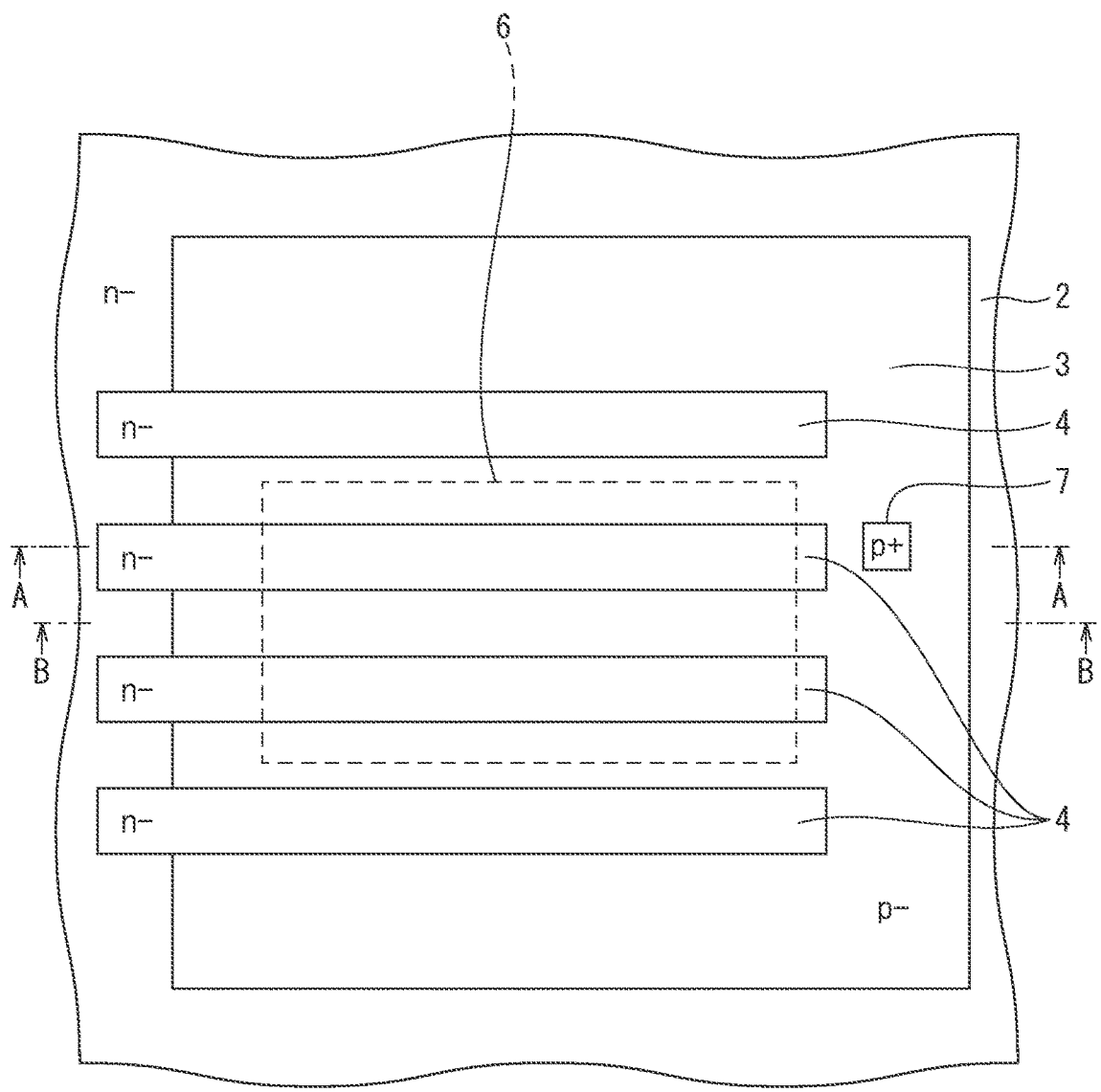
FIG. 16 is a plan view illustrating a semiconductor device according to a fifth embodiment.

A semiconductor device according to a fifth embodiment differs from the semiconductor device according to the fourth embodiment illustrated in FIG. 14 in that the planar pattern of the second semiconductor region 4 has a different planar layout, as illustrated in FIG. 16. The second semiconductor region 4 has a striped planar pattern extending parallel to each other and overlapping with the first semiconductor region 3.

Figure 17:
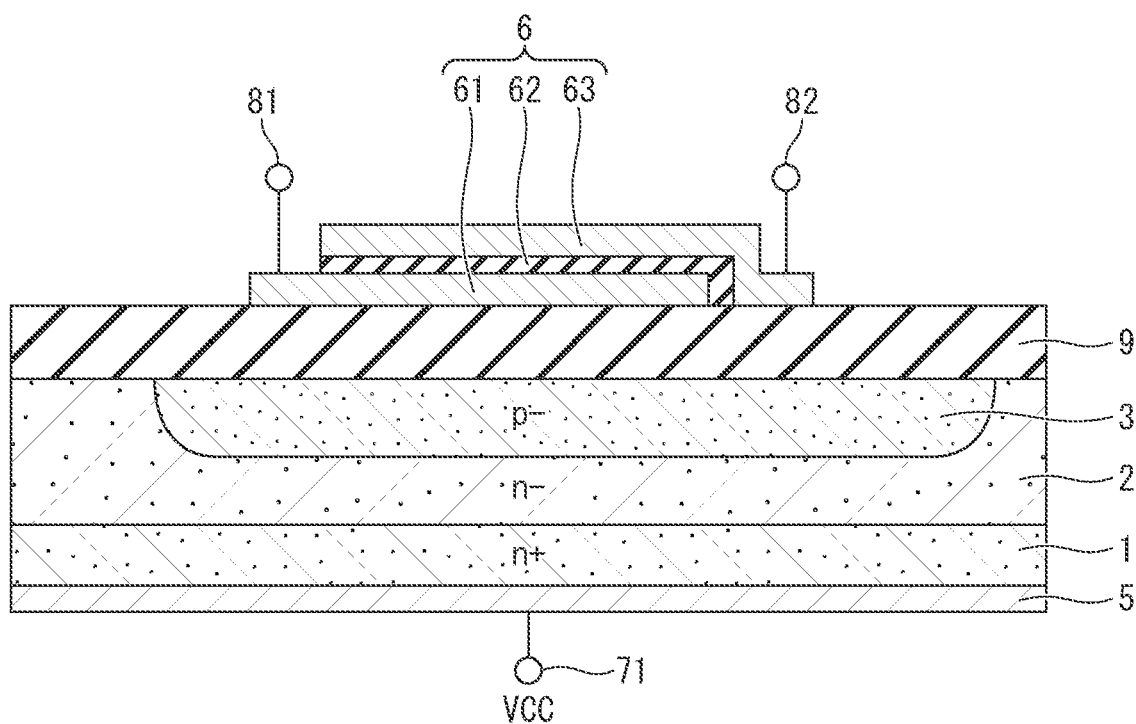
FIG. 17 is a cross-sectional view as viewed from direction B-B in FIG. 16.

The cross section as viewed from direction A-A in FIG. 16 passing through a part of the stripes of the second semiconductor region 4 corresponds to FIG. 1. The cross section as viewed from direction B-B in FIG. 16 not passing through a part of the stripes of the second semiconductor region 4 corresponds to FIG. 17. The other configurations of the semiconductor device according to the fifth embodiment are the same as those of the semiconductor device according to the fourth embodiment, and overlapping explanations are not repeated below.

The semiconductor device according to the fifth embodiment, which includes the second semiconductor region 4 having the striped planar pattern, can increase the junction area between the second semiconductor region 4 and the first semiconductor region 3, so as to facilitate the complete depletion in the region immediately under the passive element 6, as in the case of the semiconductor device according to the fourth embodiment.

Other Embodiments

As described above, the invention has been described according to the first to fifth embodiments, but it should not be understood that the description and drawings implementing a portion of this disclosure limit the invention. Various alternative embodiments of the present invention, examples, and operational techniques will be apparent to those skilled in the art from this disclosure.

While the first to fifth embodiments are each illustrated above with the case of including the passive element 6 that is the PIP capacitive element, the passive element is not limited to the PIP capacitive element. The passive element to be used may be any other capacitive element such as a metal-insulator-metal (MIM) capacitive element in which the first conductive layer 61 and the second conductive layer 63 are made of metal. The passive element to be used may also be a resistive element or a wiring layer instead of the capacitive element. The resistive element such as a polysilicon layer, when used as the passive element, may be deposited on the insulating film 9 so as to connect the terminals to both ends of the resistive element. The wiring layer made of metal, when used as the passive element, may be deposited on the insulating film 9 so as to connect the terminals to both ends of the wiring layer.

The first embodiment is illustrated above with the trench-gate MOS transistor as the output-stage element 101, but is not limited to this case. For example, the output-stage element 101 may be a trench-gate IGBT. When the output-stage element 101 is an IGBT, a semiconductor layer of p⁺-type may be used as the n⁺-type low specific resistance layer 1 illustrated in FIG. 10. The semiconductor device according to the first embodiment is illustrated above with the case of being applied to the high-side power IC used as the semiconductor integrated circuit, but may also be applied to any other semiconductor integrated circuit other than the high-side power IC.

The first to fifth embodiments are each illustrated above with the case of using Si for the semiconductor base body (1, 2), but may also be applied to a case of using a semiconductor (a wide band-gap semiconductor) material having a greater band gap than Si, such as silicon carbide (SiC), gallium nitride (GaN), diamond, and aluminum nitride (AlN). The respective configurations disclosed in the first to fifth embodiments can be combined together as appropriate without contradicting each other.

The configurations disclosed in the first to fifth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
   a semiconductor base body of a first conductivity-type;
   a first electrode electrically connected to the semiconductor base body;
   a first semiconductor region of a second conductivity-type provided at an upper part of the semiconductor base body;
   a second semiconductor region of the first conductivity-type provided at an upper part of the first semiconductor region;
   a second electrode electrically connected to the first semiconductor region;
   an insulating film provided on a top surface of the second semiconductor region; and
   a passive element provided on a top surface of the insulating film.

2. The semiconductor device of claim 1, wherein a part of the second semiconductor region is in contact with the semiconductor base body.

3. The semiconductor device of claim 1, wherein a part of the second semiconductor region extends to an outside of the first semiconductor region.

4. The semiconductor device of claim 1, wherein a region including the first semiconductor region and the second semiconductor region located immediately below the passive element is depleted due to a depletion layer spreading toward the first semiconductor region from a junction between the semiconductor base body and the first semiconductor region and a depletion layer spreading toward the first semiconductor region and the second semiconductor region from a junction between the first semiconductor region and the second semiconductor region when a first potential is applied to the first electrode and a second potential is applied to the second electrode.

5. The semiconductor device of claim 1, wherein:
   the first conductivity-type is an n-type;
   a first potential is applied to the first electrode; and
   a second potential lower than the first potential is applied to the second electrode.

6. The semiconductor device of claim 1, wherein the second semiconductor region has a striped planar pattern.

7. The semiconductor device of claim 1, wherein the second semiconductor region has a planar pattern of a comb-like shape, and a striped part corresponding to teeth of the comb-like shape overlaps with the first semiconductor region.

8. The semiconductor region of claim 1, wherein:
   the second semiconductor region is provided inside the first semiconductor region; and
   the semiconductor device further comprises a third electrode electrically connected to the second semiconductor region.

9. The semiconductor device of claim 8, wherein a region including the first semiconductor region and the second semiconductor region located immediately below the passive element is depleted due to a depletion layer spreading toward the first semiconductor region from a junction between the semiconductor base body and the first semiconductor region and a depletion layer spreading toward the first semiconductor region and the second semiconductor region from a junction between the first semiconductor region and the second semiconductor region when a first potential is applied to the first electrode, a second potential is applied to the second electrode, and a third potential is applied to the third electrode.

10. The semiconductor device of claim 8, wherein:
    the first conductivity-type is an n-type;
    a first potential is applied to the first electrode;
    a second potential lower than the first potential is applied to the second electrode; and
    a third potential higher than the second potential is applied to the third electrode.

11. The semiconductor device of claim 1, wherein the passive element is a capacitive element, a resistive element, or a wiring layer.

12. The semiconductor device of claim 11, wherein:
    the passive element is the capacitive element; and
    the semiconductor device further comprises
       a first conductive layer provided on the top surface of the insulating film,
       a dielectric film provided on a top surface of the first conductive layer, and
       a second conductive layer provided on a top surface of the dielectric film.

13. The semiconductor device of claim 12, wherein the first conductive layer and the second conductive layer are each made of polysilicon.

14. The semiconductor device of claim 1, wherein the semiconductor base body is provided with an output-stage element and a circuit element configured to control the output-stage element.

* * * * *